United States Patent
Badger et al.

(10) Patent No.: US 7,450,748 B2
(45) Date of Patent: Nov. 11, 2008

(54) MASK INSPECTION PROCESS ACCOUNTING FOR MASK WRITER PROXIMITY CORRECTION

(75) Inventors: Karen D. Badger, Georgia, VT (US); James A. Culp, Downingtown, PA (US); Azalia A. Krasnoperova, Mahwah, NJ (US)

(73) Assignee: International Business Machines Corporation, Armonk, NY (US)

( * ) Notice: Subject to any disclaimer, the term of this patent is extended or adjusted under 35 U.S.C. 154(b) by 1246 days.

(21) Appl. No.: 10/725,854

(22) Filed: Dec. 2, 2003

(65) Prior Publication Data

US 2005/0117795 A1 Jun. 2, 2005

(51) Int. Cl.
*G06K 9/00* (2006.01)
(52) U.S. Cl. .............. 382/144; 382/145; 382/147; 382/149; 382/150
(58) Field of Classification Search .......... 382/144, 382/145, 147, 149, 150
See application file for complete search history.

(56) References Cited

U.S. PATENT DOCUMENTS

| | | | |
|---|---|---|---|
| 5,804,340 A | 9/1998 | Garza et al. | |
| 6,091,845 A | 7/2000 | Pierrat et al. | |
| 6,272,236 B1 | 8/2001 | Pierrat et al. | |
| 6,363,296 B1 | 3/2002 | Schulze | |
| 6,516,085 B1 | 2/2003 | Wiley et al. | |
| 2002/0018207 A1* | 2/2002 | Ina et al. | 356/400 |
| 2002/0164064 A1 | 11/2002 | Karklin et al. | |
| 2003/0013213 A1* | 1/2003 | Shin | 438/14 |

FOREIGN PATENT DOCUMENTS

JP 9297109 11/1997

\* cited by examiner

*Primary Examiner*—Matthew C. Bella
*Assistant Examiner*—Mike Rahmjoo
(74) *Attorney, Agent, or Firm*—Schmeiser, Olsen & Watts; H. D. Schnurmann (57) ABSTRACT

A mask inspection method and system. Provided is a mask fabrication database describing geometrical shapes S to be printed as part of a mask pattern on a reticle to fabricate a mask through use of a mask fabrication tooling. The shapes S appear on the mask as shapes S' upon being printed. At least one of the shapes S' may be geometrically distorted relative to a corresponding at least one of the shapes S due to a lack of precision in the mask fabrication tooling. Also provided is a mask inspection database to be used for inspecting the mask after the mask has been fabricated by the mask fabrication tooling. The mask inspection database describes shapes S" approximating the shapes S'. A geometric distortion between the shapes S' and S" is less than a corresponding geometric distortion between the shapes S' and S.

2 Claims, 12 Drawing Sheets

MASK INSPECTION PROCESS ACCOUNTING FOR MASK WRITER PROXIMITY CORRECTION

BACKGROUND OF THE INVENTION

1. Technical Field

The present invention relates to a method and system for inspecting a mask formed using mask fabrication tooling.

2. Related Art

A mask pattern that includes a plurality of geometrical shapes may be written on a reticle to form a mask. The mask pattern enables the reticle to serve as a mask for printing semiconductor wafers to form integrated circuits. After the reticle with a mask pattern thereon has been fabricated, the reticle is typically inspected to ensure that the mask pattern has been correctly formed on the reticle. Currently mask inspection tools compare the mask pattern physically formed on the reticle with geometric shapes stored in a database. With current mask fabrication and inspection technology, inspection of the mask may indicate a false positive or fail to find a real defect. With respect to a false positive, for example, certain masks patterns may fail the inspection for cases in which the written mask patterns are correct. Accordingly, there is a need for a mask pattern inspection process and system which reduces or eliminates such false positive indications and is better able to find real defects.

SUMMARY OF THE INVENTION

The present invention provides a mask inspection method, comprising:

providing a mask fabrication database describing geometrical shapes S to be printed as part of a mask pattern on a reticle to fabricate a mask through use of a mask fabrication tooling, said geometrical shapes S appearing on the mask as geometrical shapes S' upon being printed by the mask fabrication tooling in accordance with the mask fabrication database, at least one of said geometrical shapes S' being geometrically distorted relative to a corresponding at least one of said geometrical shapes S due to a lack of precision in the mask fabrication tooling; and providing a mask inspection database to be used for inspecting the mask after the mask has been fabricated by the mask fabrication tooling using the mask fabrication database, said mask inspection database describing geometrical shapes S" approximating said geometrical shapes S', a geometric distortion between said geometrical shapes S' and said geometrical shapes S" being less than a corresponding geometric distortion between said geometrical shapes S' and said geometrical shapes S.

The present invention provides a mask inspection system, comprising:

means for providing a mask fabrication database describing geometrical shapes S to be printed as part of a mask pattern on a reticle to fabricate a mask through use of a mask fabrication tooling, said geometrical shapes S appearing on the mask as geometrical shapes S' upon being printed by the mask fabrication tooling in accordance with the mask fabrication database, at least one of said geometrical shapes S' being geometrically distorted relative to a corresponding at least one of said geometrical shapes S due to a lack of precision in the mask fabrication tooling; and means for generating a mask inspection database to be used for inspecting the mask after the mask has been fabricated by the mask fabrication tooling using the mask fabrication database, said mask inspection database describing geometrical shapes S" approximating said geometrical shapes S', a geometric distortion between said geometrical shapes S' and said geometrical shapes S" being less than a corresponding geometric distortion between said geometrical shapes S' and said geometrical shapes S.

The present invention advantageously provides a mask inspection process and system which reduces or eliminates false positive indications for mask patterns written on reticles and is better able to find real defects.

DETAILED DESCRIPTION OF THE INVENTION

Figure 1:
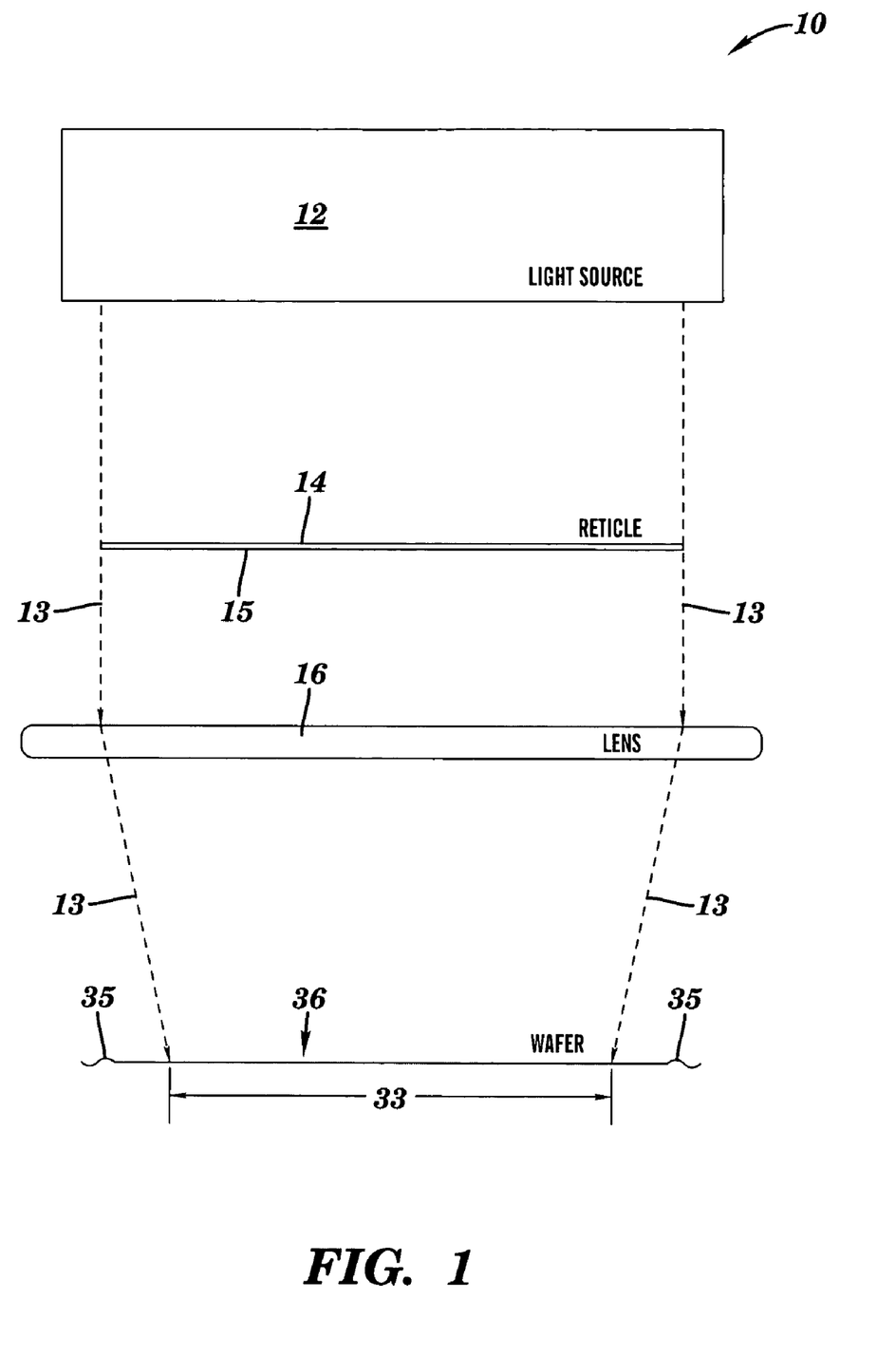
FIG. 1 depicts a front view of an exposure apparatus over a wafer, in accordance with embodiments of the present invention.

FIG. 1 depicts a front view of an exposure apparatus 10 over a wafer 36, in accordance with embodiments of the present invention. The exposure apparatus 10 comprises a light source 12, a reticle 14, and a lens 16. The reticle 14, which may include a transparent material such as quartz, serves as a mask having transparent and opaque regions that are defined by a mask pattern as shown in FIG. 4. The reticle 14, which comprises said mask pattern, is called a "mask."

The light source 12 is any type of light source (e.g., an ultraviolet light source) that is known the art for printing a wafer. The mask 14 may comprise, inter alia, a sheet of glass coated with chrome on a backside 15 of the mask 14. The lens 16 focuses light 13 from the light source 12 onto the wafer 36. The wafer 36 comprises a device field 33 and a remaining portion 35. The device field 33 of the wafer 36 comprises electrical devices such as semiconductor devices (e.g., integrated circuit chips). The remaining portion 35 of the wafer 36 includes peripheral space in a peripheral portion of the wafer 36. A more complete view of the wafer 36 may be found FIG. 3 which shows device fields 41-49 and the peripheral portion 38 of the wafer 36. The device field 33 of FIG. 1 represents any one of the device fields 41-49 of FIG. 4.

Figure 2:
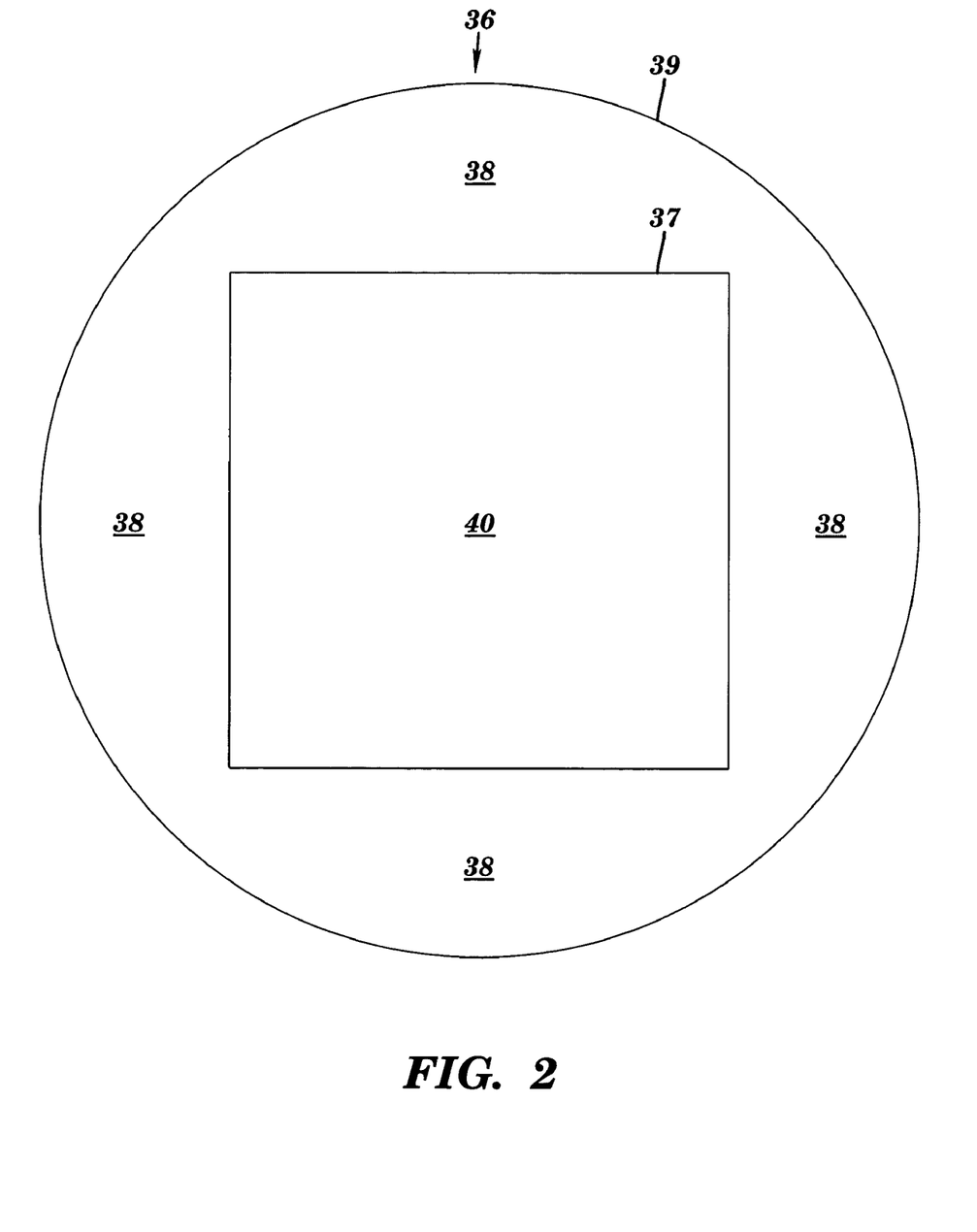
FIG. 2 depicts a top view of the wafer of FIG. 1, in accordance with embodiments of the present invention.

FIG. 2 depicts a top view of the wafer 36 of FIG. 1, in accordance with embodiments of the present invention. FIG. 2 shows that wafer 36 comprises an active portion 40 and a peripheral portion 38. The peripheral portion 38 of the wafer 36 is between the outer boundary 37 of the active portion 40 and the outer boundary 39 of the peripheral portion 38. The outer boundary 39 of the peripheral portion 38 is also the outer boundary of the wafer 36 itself. Although the outer boundary 39 of the wafer 36 is shown in FIG. 2 as having a circular shape, the outer boundary 39 may have any geometrical shape (e.g., an elliptical shape, a rectangular shape, an octagonal shape, etc.) capable of containing an active portion. Although the outer boundary 37 of the active portion 40 of the wafer 36 is shown in FIG. 2 as having a square shape, the outer boundary 37 of the active portion 40 may have any geometrical shape (e.g., a polygon).

Figure 3:
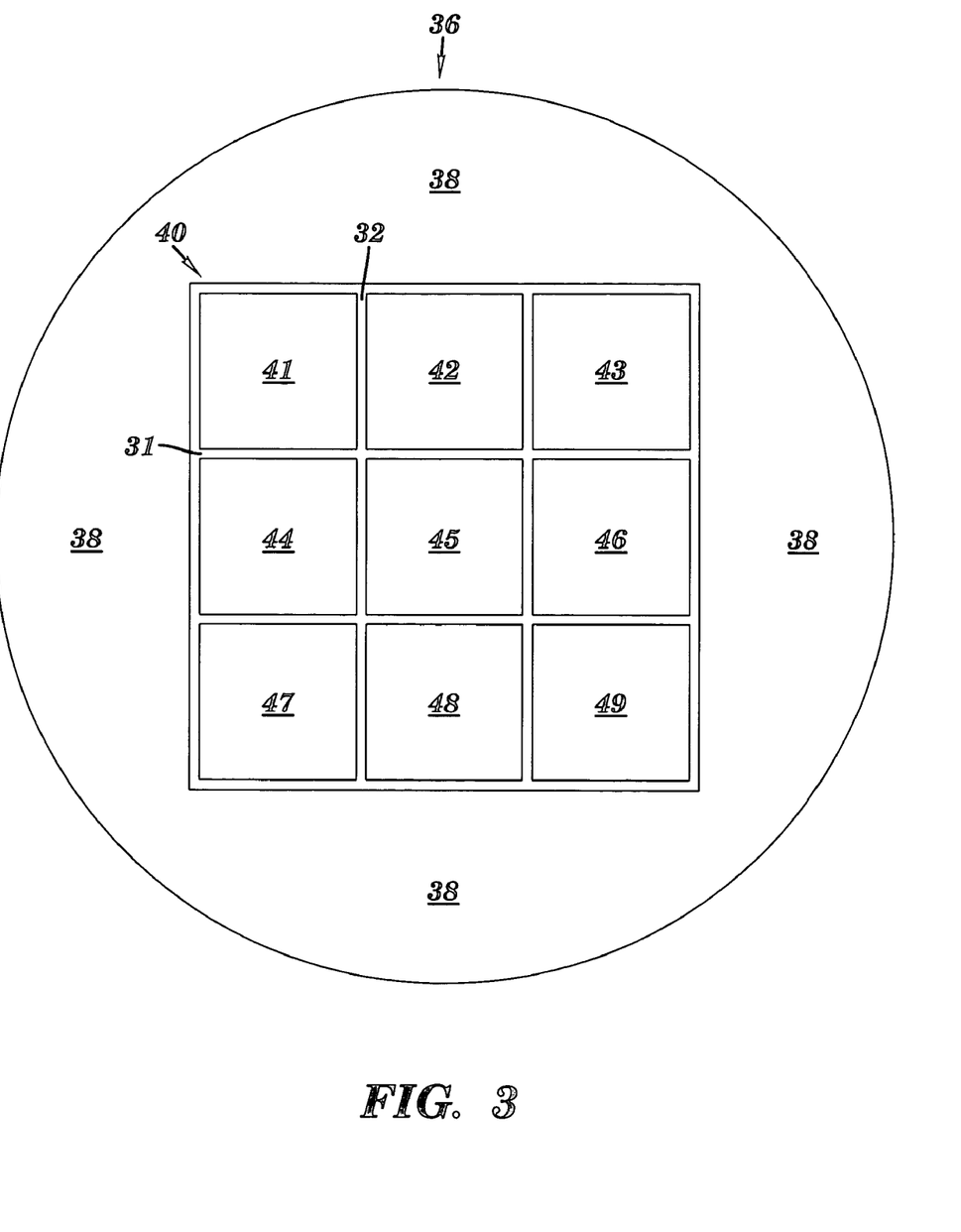
FIG. 3 depicts a top view of the wafer of FIG. 2 showing a distribution of device fields in an active area of the wafer, in accordance with embodiments of the present invention.

FIG. 3 depicts a top view of the wafer 36 of FIG. 2 showing a distribution of the device fields 41-49 in the active portion 40 of the wafer 36, in accordance with embodiments of the present invention. The device fields 41-49 each comprise an area in which one or more devices, such as semiconductor devices (e.g., integrated circuit chips) are to be printed by the exposure apparatus 10 of FIG. 1. Although FIG. 3 shows nine device fields, the wafer 36 generally includes any number of device fields. The space between adjacent device fields is called a "kerf", such as a kerf 31 between device fields 41 and 44 or a kerf 32 between device fields 41 and 42. Although the outer boundary of the active portion 40 of the wafer 36 is shown in FIG. 3 as having a square shape, the outer boundary of the active portion 40 may have any geometrical shape (e.g., a polygon).

Figure 4A:
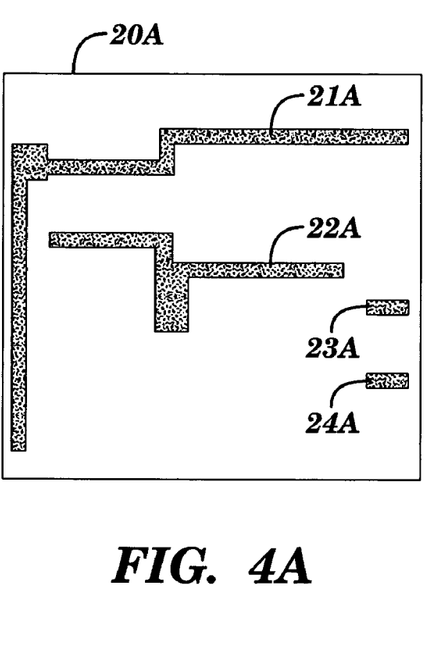
FIGS. 4A-4C respectively depict a top view of an exemplary integrated circuit design, a reticle, and a wafer, in accordance with embodiments of the present invention

FIG. 4A depicts a top view of an exemplary integrated circuit (IC) design 20A having geometric shapes 21A, 22A, 23A, and 24A, in accordance with embodiments of the present invention.

Figure 4B:
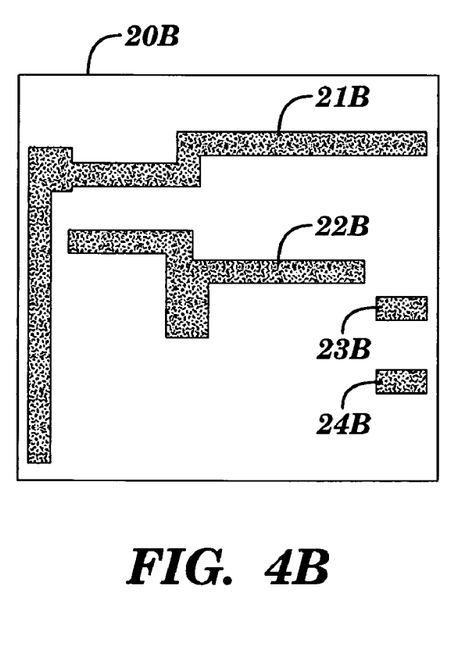

FIG. 4B depicts a top view of a reticle 20B having transparent regions (e.g., transparent to light provided by the light source 12 of FIG. 1) and opaque regions (e.g., opaque to light provided by the light source 12 of FIG. 1, in accordance with embodiments of the present invention. The opaque regions selectively block light provided by the light source from reaching the wafer, so that the combination of the transparent and opaque regions defines a mask pattern that enables the wafer to be printed in accordance with said mask pattern.

In FIG. 4B, the opaque regions of the reticle 20B include geometric shapes 21B, 22B, 23B, and 24B respectively corresponding to the design shapes 21A, 22A, 23A, and 24A of FIG. 4A. Optical effects caused by the lens 16 of FIG. 1 may cause distortion of the image printed on the wafer 36, such as causing a rectangular shape to be printed as a distorted shape having curvature along its perimeter. Thus, design shapes printed on the reticle include optical proximity corrections (OPC) which distorts the design shapes in a manner opposite to the distortions caused by the lens so that the design shapes will be correctly printed on the wafer to a desired degree of accuracy through cancellation of the OPC-induced distortions and the optical distortions caused by the lens. Therefore, the shapes 21B, 22B, 23B, and 24B on the reticle 20B of FIG. 4B are OPC-distorted relative to the corresponding shapes 21A, 22A, 23A, and 24A of FIG. 4A.

Figure 4C:
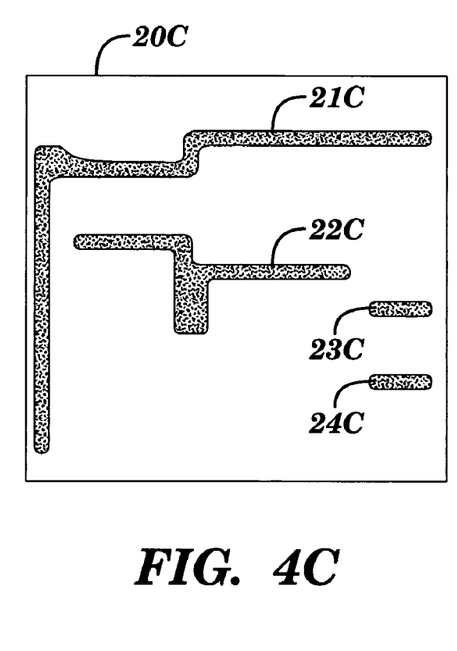

FIG. 4C depicts a top view of a wafer 20C printed by using the reticle 20B of FIG. 4B. The printed wafer 20C includes shapes 21C, 22C, 23C, and 24C respectively corresponding to the shapes 21B, 22B, 23B, and 24B on the reticle 20B of FIG. 4B, and also respectively corresponding to the design shapes 21A, 22A, 23A, and 24A of FIG. 4A. Note that most of the geometric distortion of shapes 21B, 22B, 23B, and 24B on the reticle 20B of FIG. 4B do not appear in the 21C, 22C, 23C, and 24C on the wafer 20C of FIG. 4C, because the OPC distortions designed into the mask of FIG. 4B has substantially canceled the optical distortions caused by the lens as explained supra.

Figure 5:
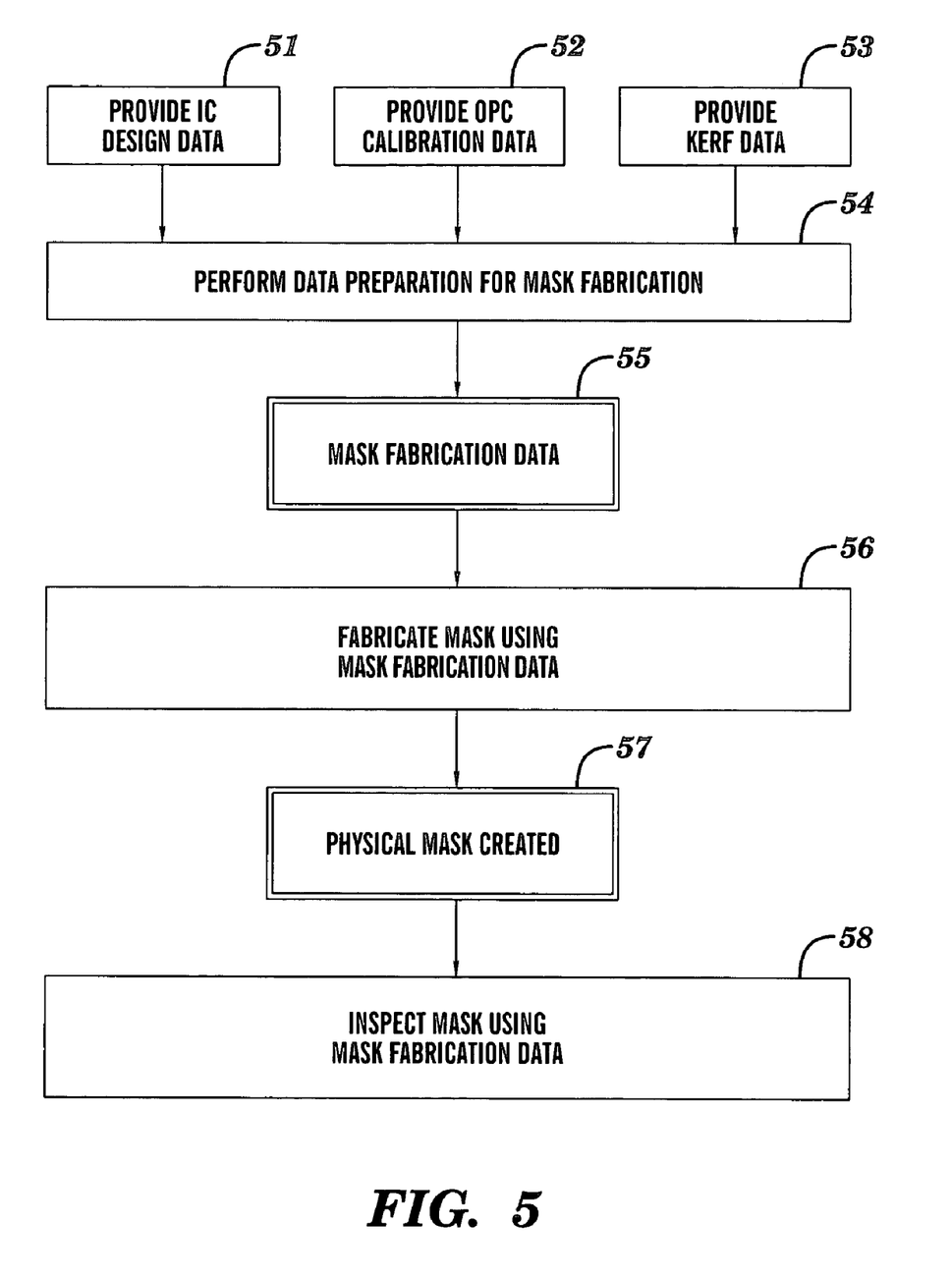
FIG. 5 is a flow chart of a process for fabricating a mask and inspecting the fabricated mask using mask fabrication data, in accordance with embodiments of the present invention

FIG. 5 is a flow chart depicting steps 51-58 of a process for fabricating a mask and inspecting a fabricated mask using mask fabrication data, in accordance with embodiments of the present invention. Steps 51-53 provide data to be utilized for writing a mask pattern on a reticle to form the mask. The mask pattern enables the reticle to serve as a mask for printing semiconductor wafers to form integrated circuits.

Step 51 provides data describing an integrated circuit (IC) design to be printed on a semiconductor wafer. Included in the IC design data are geometrical data describing geometrical shapes (e.g., dimensions, angles, etc.) and the relative locations of the geometrical shapes on the wafer. See FIG. 4A, described supra, showing a top view of an IC design. In practice, said geometrical data needs to be encoded on a reticle as transparent and opaque regions on the reticle to form a mask pattern on the reticle, such as the mask pattern described by shapes 21B, 22B, 23B, and 24B on the reticle 20B of FIG. 4B, described supra. 1. In FIG. 1, the light from the light source 12 is selectively passed through the reticle 14 by the mask pattern so as to print the IC design on the wafer 36. Thus, the IC design data provided in step 51 of FIG. 5 is the fundamental data used to form the mask pattern on the reticle.

As explained supra, optical effects caused by the lens 16 of FIG. 1 will cause distortion of the image printed on the wafer 36, such as causing a rectangular shape to be printed as a distorted shape having curvature along its perimeter. Thus, step 52 of FIG. 5 provides OPC calibration data, which is combined in step 54 with the IC design data of step 51 to compensate for sources of error such as the geometric distortions caused by the lens 16 of FIG. 1, such that a rectangular shape may be printed on the wafer as the same rectangular shape with no distortion. See FIG. 4B, described supra, showing a top view of a mask pattern on a reticle including OPC calibration data.

Step 53 provides kerf data, so that kerfs such as the kerfs 31 and 32 of FIG. 4 may be accurately represented on the wafer.

Step 54 receives the IC design data, the OPC calibration data, and kerf data provided in steps 51, 52, and 53, respectively, and prepares said data so that said data can be used for fabricating the mask in step 56. Resulting from step 54 is the mask fabrication data shown in step 55.

Step 56 fabricates the mask pattern using the mask fabrication data of step 55. Resulting from step 56 is the physical mask (or reticle) shown in step 57.

In step 58, the physical mask is inspected by comparing the geometrical properties (e.g., spatial dimensions) of the physical mask of step 57 with the mask fabrication data shown in step 55. The various results of said inspection in step 58 will next be discussed in conjunction with FIGS. 6 and 7.

Figure 6:
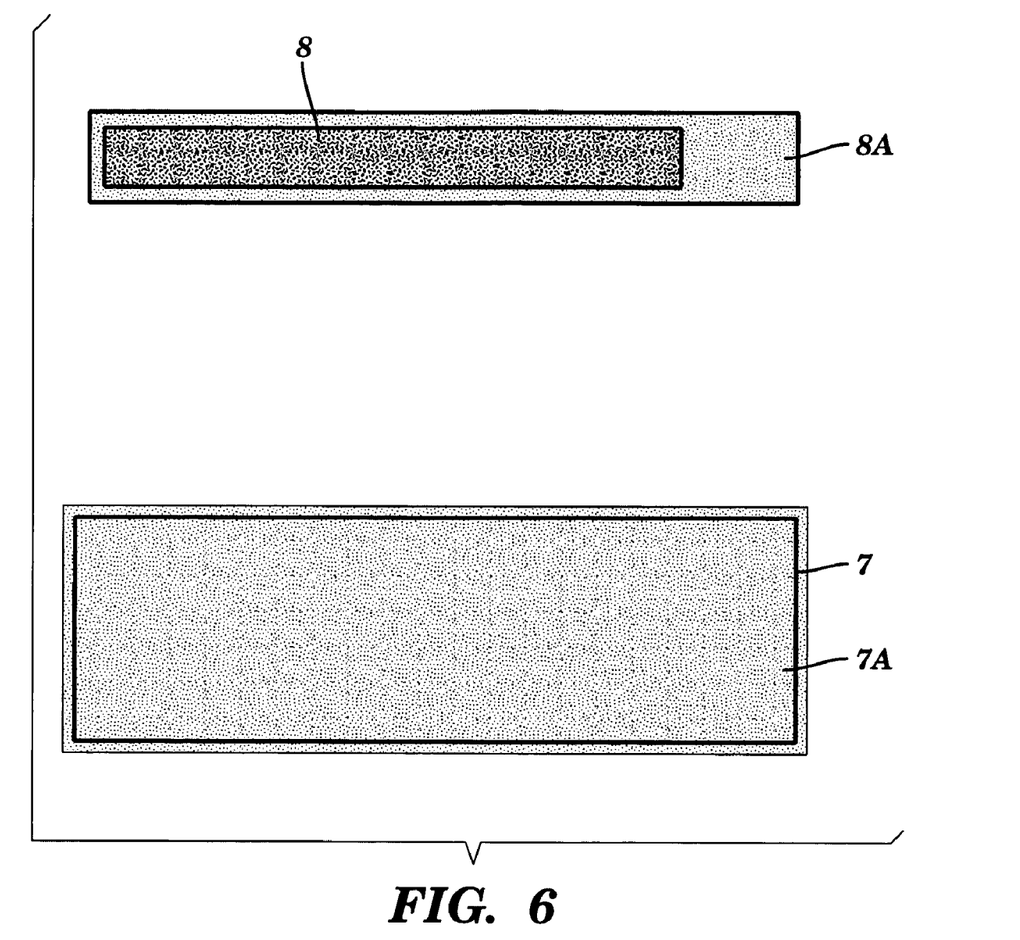
FIG. 6 depicts geometrical distortion of a shape printed on a mask through use of mask fabrication tooling, in accordance with embodiments of the present invention.

FIG. 6 depicts shapes 7A and 8A, each said shape being comprised by the mask fabrication database in step 55 of FIG. 5, in accordance with embodiments of the present invention. As a result of the mask fabrication step 56 of FIG. 5, the shapes 7A and 8A are printed as shapes 7 and 8, respectively, on the physical mask. FIG. 6 shows that shape 7 on the physical mask essentially replicates the corresponding shape 7A of the mask fabrication data, so that shape 7 will pass the inspection step 58 of FIG. 5.

FIG. 6 also shows that shape 8 on the physical mask differs significantly from the corresponding shape 8A of the mask fabrication data; i.e., shape 8 is shorter and thinner than shape 8A, in accordance with embodiments of the present invention. It is assumed herein that the difference between shapes 8A and 8 is due to a lack of precision in the mask fabrication tooling ("mask writer"). However, the OPC data in step 52 of FIG. 5 already accounts for the distortion being due to a lack of precision in the mask fabrication tooling. Thus the distorted shape 8 in FIG. 6 is a correct shape because its OPC-compensated distortion will cause a substantially correct shape to be subsequently printed on the wafer. However, the shape 8 on the physical mask will erroneously fail the inspection because of the differential between shapes 8 and 8A. Therefore, the shape 8 may be said to be overdetermined, relative to shape 8A, for mask inspection purposes.

Figure 7:
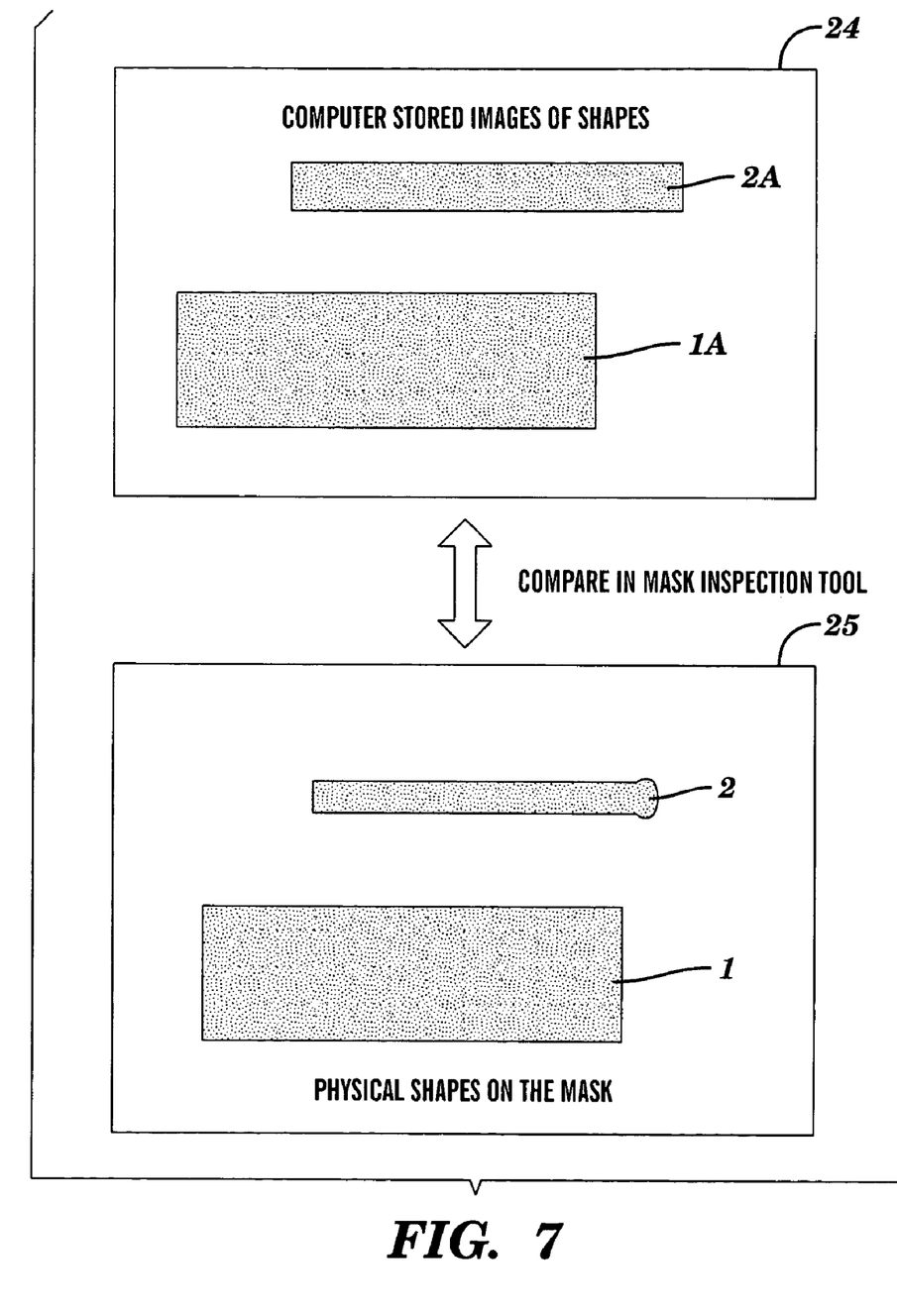
FIG. 7 depicts a comparison between shapes stored in a mask fabrication database and shapes printed on a physical mask, in accordance with embodiments of the present invention.

FIG. 7 depicts a comparison between shapes stored in a mask fabrication database 24 and shapes printed on a physical mask 25, in accordance with embodiments of the present invention. In FIG. 7, shapes 1A and 2A in the mask fabrication database 24 include OPC calibrations and respectively correspond to the shapes 1 and 2 in the physical mask 25. FIG. 7 shows that shape 1 on the physical mask 25 essentially replicates the corresponding shape 1A of the mask fabrication data 24, so that shape 1 will pass the inspection step 58 of FIG. 5. FIG. 7 also shows that shape 2 on the physical mask 25 differs significantly from the corresponding shape 2A of the mask fabrication data 24; i.e., shape 2 is shorter, thinner, and more curved than shape 2A. It is assumed herein that the difference between shapes 2A and 2 is due to a lack of precision in the mask fabrication tooling. However, the OPC data in step 52 of FIG. 5 already accounts for the distortion being due to a lack of precision in the mask fabrication tooling. Thus the distorted shape 2 in FIG. 7 is a correct shape because its OPC-compensated distortion will cause a substantially correct shape to be subsequently printed on the wafer. However, the shape 2 will erroneously fail the inspection because of the differential between shapes 2 and 2A. Therefore, the shape 2 may be said to be overdetermined, relative to shape 2A, for mask inspection purposes.

Figure 8:
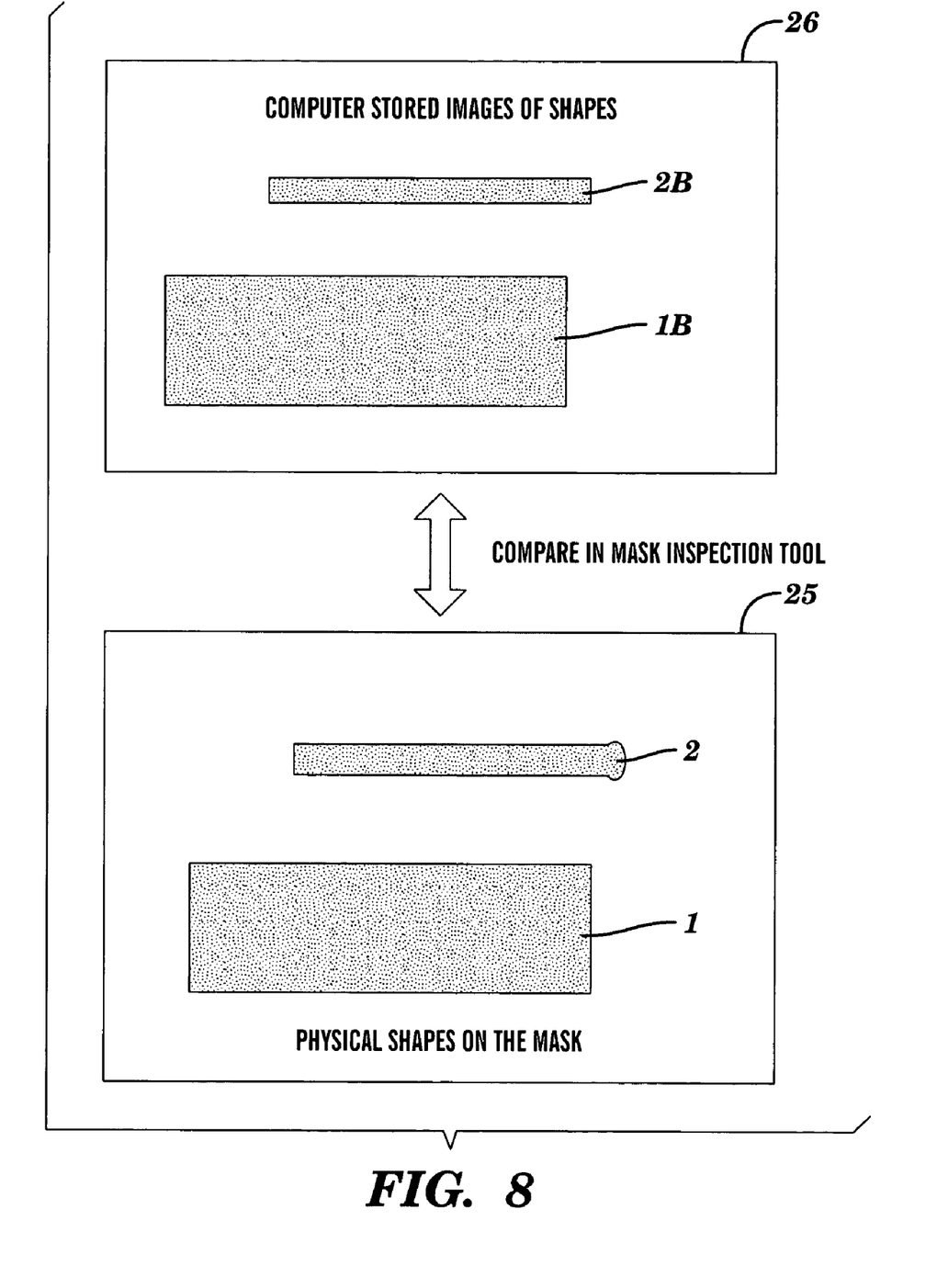
FIG. 8 depicts a comparison between shapes stored in a mask inspection database and shapes printed on a physical mask, in accordance with embodiments of the present invention.

From the preceding discussion of FIGS. 6 and 7, it is seen that the mask inspection procedure is susceptible to yielding false positive indications for cases when the OPC calibrations result in overdetermined shapes printed on the physical mask. In response to this difficulty, FIG. 8 depicts a mask inspection database 26 which includes shapes 1B and 2B respectively corresponding to the shapes 1A and 2A in the mask fabrication database 24 of FIG. 7. The shapes in the mask inspection database 26 represent a transformation of the shapes in the mask fabrication database 24 such that the resultant shapes in the mask inspection database 26 are to be used for the mask inspection process instead of the shapes in the mask fabrication database 24. The transformation yielding the shapes in the mask inspection database 26 compensates for the lack of precision in the mask fabrication tooling and substantially or essentially eliminates false positive indications of the type discussed supra.

In FIG. 8, shape 1B in the mask inspection database 26 is essentially unchanged from the shape 1A in the mask fabrication data 24 of FIG. 7, because shape 1A is essentially the same as shape 1 on the physical mask 25. Thus, shape 1 on the physical mask 25 will pass the mask inspection test regardless of whether shape 1 is compared with shape 1A of the mask fabrication data 24 of FIG. 7 or with shape 1B of the mask inspection data 26 of FIG. 8.

In contrast, shape 2B of the mask inspection database 26 of FIG. 8 is substantially different from the corresponding shape 2A of the mask fabrication database 24 of FIG. 7 due to the transformation. Shape 2B of the mask inspection database 26 is sufficiently close to the shape 2 of the physical mask 25 that the shape 2 is likely to pass the mask inspection if shape 2 is compared with shape 2B. Thus, the present invention advantageously discloses the mask inspection database 26, to be used for mask inspection purposes, which substantially or essentially eliminates false positive indications of the type discussed supra. Thus, geometric distortion between geometrical shapes on the physical mask 25 and geometrical shapes in the mask inspection database 26 is adapted to be no more than (and less than in some instances) a corresponding geometric distortion between the geometrical shapes on the physical mask 25 and the geometrical shapes in the mask fabrication database 24.

Figure 9:
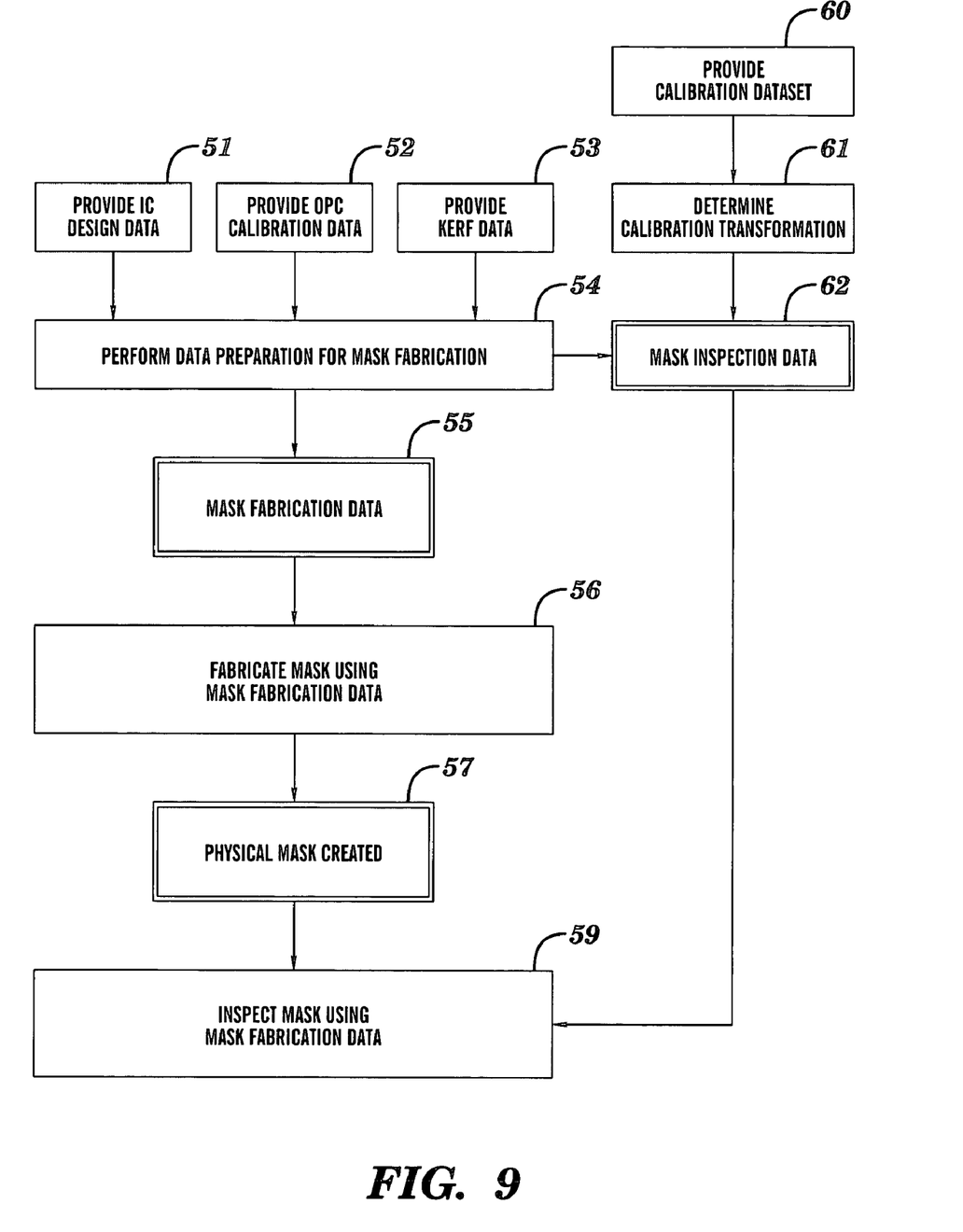
FIG. 9 is a flow chart of a process for fabricating a mask and inspecting the fabricated mask using mask inspection data based on a calibration dataset, in accordance with embodiments of the present invention.

In consideration of the discussion supra of FIG. 8, FIG. 9 depicts a flow chart of a process for fabricating a mask and inspecting the fabricated mask using mask inspection data based on a calibration, in accordance with embodiments of the present invention. The flow chart of FIG. 9 is the same as the flow chart of FIG. 5, except that step 58 of FIG. 5 has been replaced by step 59 of FIG. 9 and steps 60-62 have been added.

In FIG. 9, step 62 generates a mask inspection database, and the shapes in the mask inspection database are utilized in the mask inspection step 59. Steps 60-61 cause the mask inspection database of step 62 to be generated. Step 60 provides a calibration dataset which is a database indicating the effect on the shapes in the mask fabrication database 55 of a lack of precision in the mask fabrication tooling, as will be discussed in detail infra in conjunction with FIG. 11. Step 61 determines a calibration transformation to be applied to the shapes in the mask fabrication database 55 to generate the corresponding shapes in the mask inspection database 62. The calibration transformation of step 61 is derived from the calibration dataset of step 60. Details relating to this calibration transformation will be discussed infra in conjunction with FIGS. 11-12.

In an embodiment relating to the flow chart of FIG. 9, the mask fabrication database may be provided to a mask fabrication vendor, the mask inspection database may be provided to the mask fabrication vendor, printing the mask may be performed by the mask fabrication vendor, and inspecting the fabricated mask may be performed by the mask fabrication vendor. The mask fabrication vendor may additionally perform testing that generates the calibration dataset of step 60. It is also within the scope of the present invention for some or all of the preceding steps (i.e., providing the mask fabrication database, providing the mask inspection database, printing the mask, inspecting the mask, etc.) to be performed one entity (e.g., a person or organization) or by multiple entities.

Figure 10:
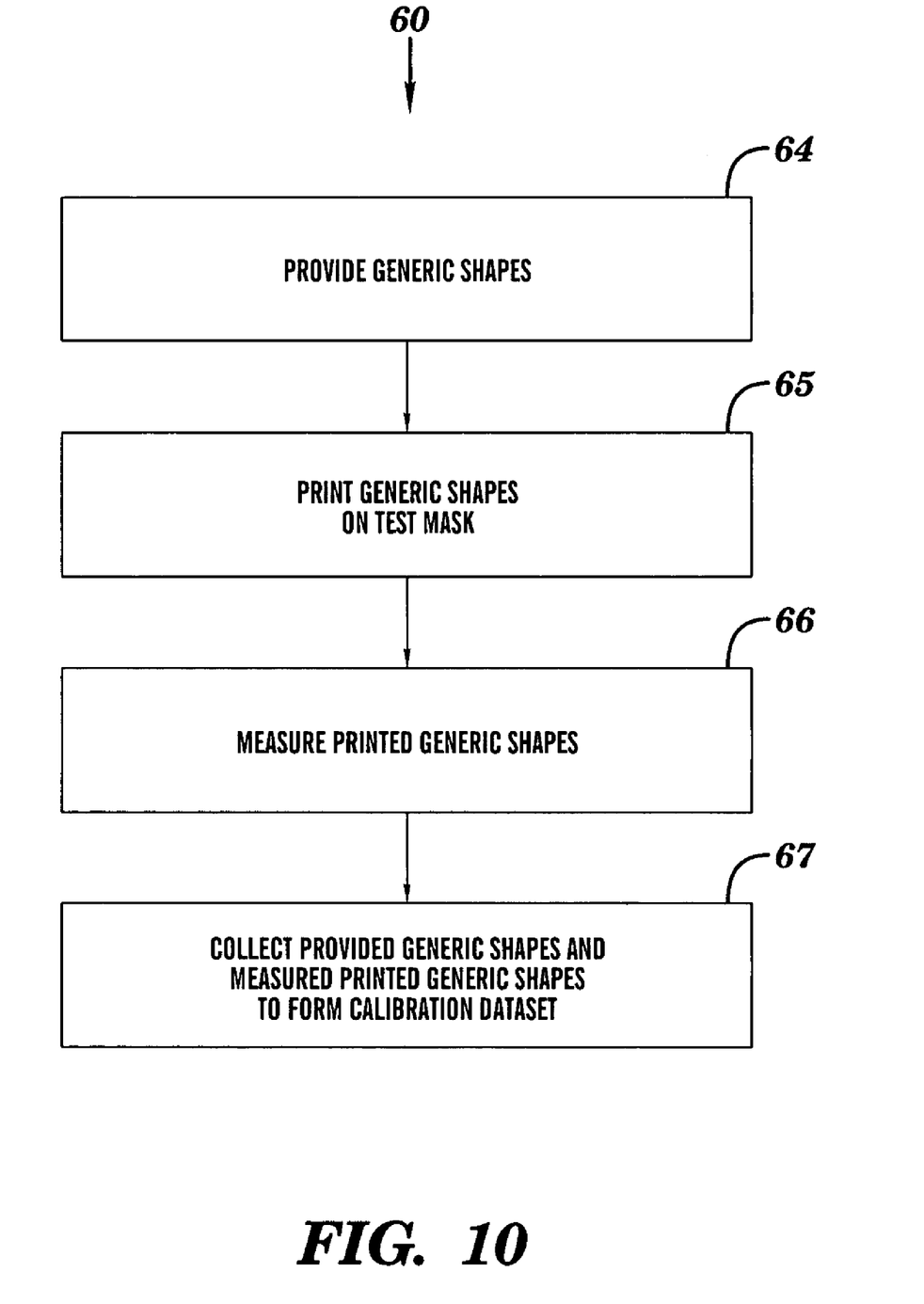
FIG. 10 is a flow chart for providing the calibration dataset of FIG. 9, in accordance with embodiments of the present invention.

FIG. 10 is a flow chart, comprising steps 64-67, for providing the calibration dataset of step 60 of FIG. 9, in accordance with embodiments of the present invention. Step 64 provides a set of generic geometric shapes which will be used for developing the calibration dataset. Such geometric shapes may include, inter alia, rectangles, squares, triangles, etc. of varying geometric dimensions. The generic shapes are for test purposes and the generic shapes may not comprise, and may not comprised by, an integrated circuit design. Step 65 prints the generic shapes of step 64 on a test mask, using the same mask fabrication tooling as is used in fabricating the physical mask. Step 66 measures the printed generic shapes on the test mask. Any distortion for the shapes printed on the test mask caused by the mask fabrication tooling is assumed to be essentially the same as similar distortion that would be produced in a real physical mask for the same generic shapes of a mask fabrication database using the same mask fabrication tooling. Step 67 collects the provided generic shapes of step 64 and the measured printed generic shapes of step 66 to form the calibration dataset. Thus, the calibration dataset includes data as to how a lack of precision in the mask fabrication tooling causes distortion of the generic geometric shapes provided in step 64.

For a given shape in the mask fabrication database 55 of FIG. 9, it is desired to accurately predict the distortion of the given shape when printed on a real physical mask by the mask fabrication tooling. If said distortion could be accurately predicted, then a transformation (see step 61 of FIG. 9) could be used to transform the given shape in the mask fabrication database to a newly distorted shape to be placed in the mask inspection database. The given shape will be printed on the physical mask as a close approximation to the newly distorted shape in the mask inspection database.

In FIG. 9, the calibration transformations of step 61 may be derived from the calibration dataset of step 60 by performing any data reduction or modeling technique, such as curve fitting or statistical regression of the calibration dataset 60. As an example, the transformation of shapes 1A and 2A in the mask fabrication database 24 of FIG. 7 to the shapes 1B and 2B, respectively, in the mask inspection database 26 of FIG. 8 is an example of such a transformation. A discussion of FIGS. 11-12 infra will provide factors which enable such transformations to be arrived at. Such a transformation may be expressed in any useful form such as, inter alia, equations or formulas, tables, graphs, etc. Said transformations in step 61 of FIG. 9 operate on the shapes in the mask fabrication database to form the mask inspection data 62 in FIG. 9. Then the mask inspection data 62 in FIG. 9 is used in step 59 to inspect the physical mask created in step 57.

Figure 11:
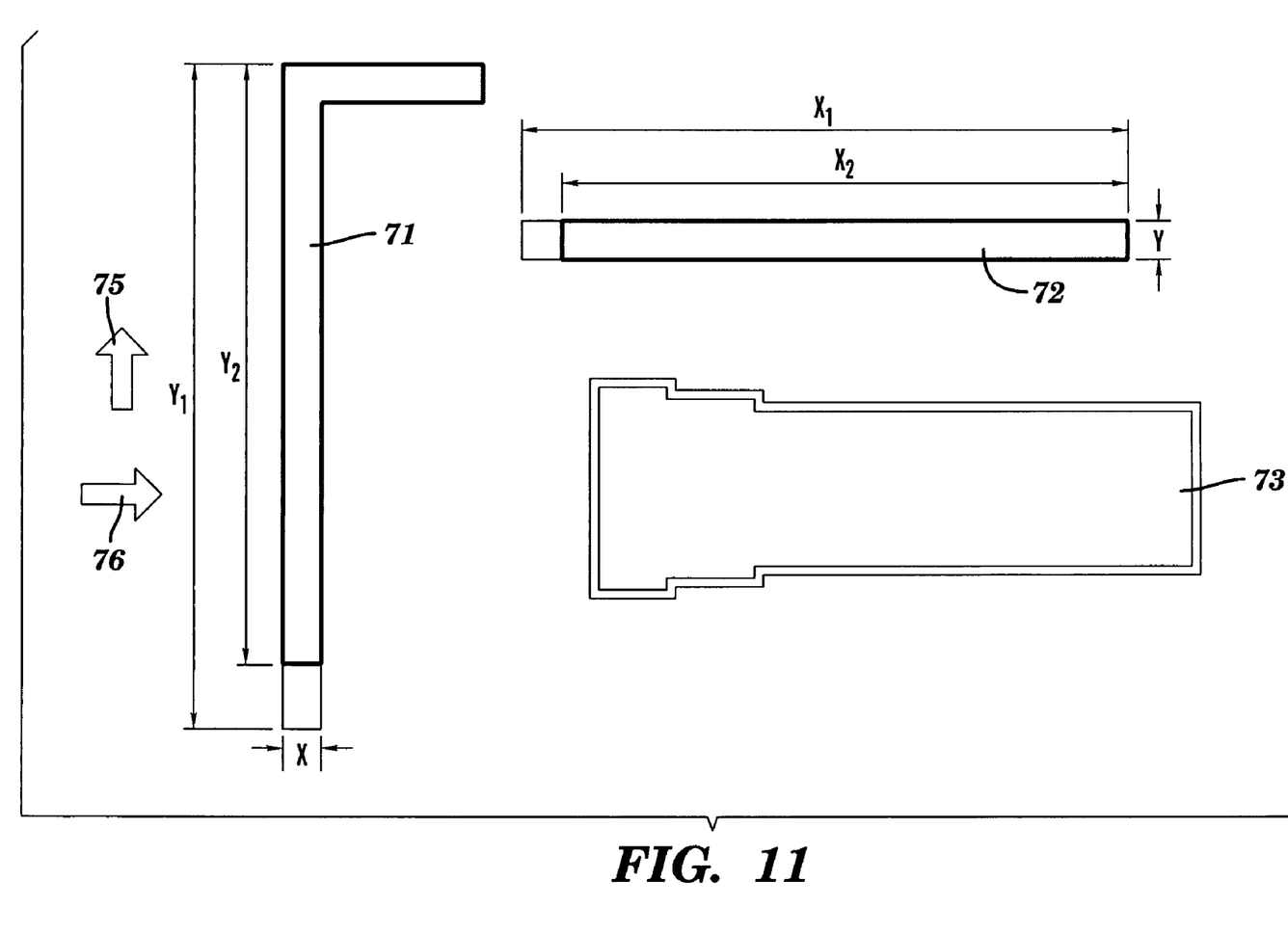
FIG. 11 depicts transformation of shapes from a mask fabrication database to a mask inspection database, in accordance with embodiments of the present invention.

FIG. 11 depicts a transformation of shapes 71, 72, and 73 from a mask fabrication database to a mask inspection database, in accordance with embodiments of the present invention. The shape 71 has a geometrical form of an "L". In the mask fabrication database, the portion of shape 71 oriented parallel to the direction 75 has dimension of $Y_1$ in the direction 75 and a dimension of X in the direction 76, wherein the direction 76 is orthogonal to the direction 75. In the mask inspection database, the portion of shape 71 oriented parallel to the direction 75 has dimension of $Y_2$ in the direction 75 and the dimension of X in the direction 76. In some embodiments, $Y_1 > Y_2$ denoting foreshortening in the direction 75 in going from the mask fabrication database to the mask inspection database. In some embodiments, $Y_1 - Y_2$ is a function of X. In some embodiments, $Y_1 - Y_2$ tends to increase as X decreases, and vice versa such that for a sufficiently large value of X, the differential $Y_1 - Y_2$ is about equal to zero. In other embodiments, $Y_1 - Y_2$ is a function of X and $Y_1$, or a function of $Y_2$ alone. Generally, $Y_1 - Y_2$ may be a function of a geometrical characteristic of the shape 71.

The shape 72 is oriented in the direction 76, has a dimension of $X_1$ in the mask fabrication database, and a dimension of $X_2$ in the mask inspection database. The shape 72 has a dimension of Y in the direction 75 for both the mask fabrication database and the mask inspection database. In some embodiments, $X_1 > X_2$ denoting foreshortening in the direction 76 in going from the mask fabrication database to the mask inspection database. In some embodiments, $X_1 - X_2$ is a function of Y. In some embodiments, $X_1 - X_2$ tends to increase as Y decreases, and vice versa such that for a sufficiently large value of Y, the differential $X_1 - X_2$ is about equal to zero. In other embodiments, $X_1 - X_2$ is a function of Y and $X_1$, or a function of $X_1$ alone. Generally, $X_1 - X_2$ may be a function of a geometrical characteristic of the shape 72.

The shape 73 is the same in both the mask fabrication database and the mask inspection database, reflecting an embodiment wherein if a shape dimension in a given direction is sufficiently large in the mask fabrication database, then there is essentially no distortion in a direction orthogonal to the given direction. For shape 73, the dimensions in both direction 76 and 75 are sufficient large such that there is essentially no distortion of the shape 73 in the mask inspection database relative to the mask fabrication database.

Figure 12:
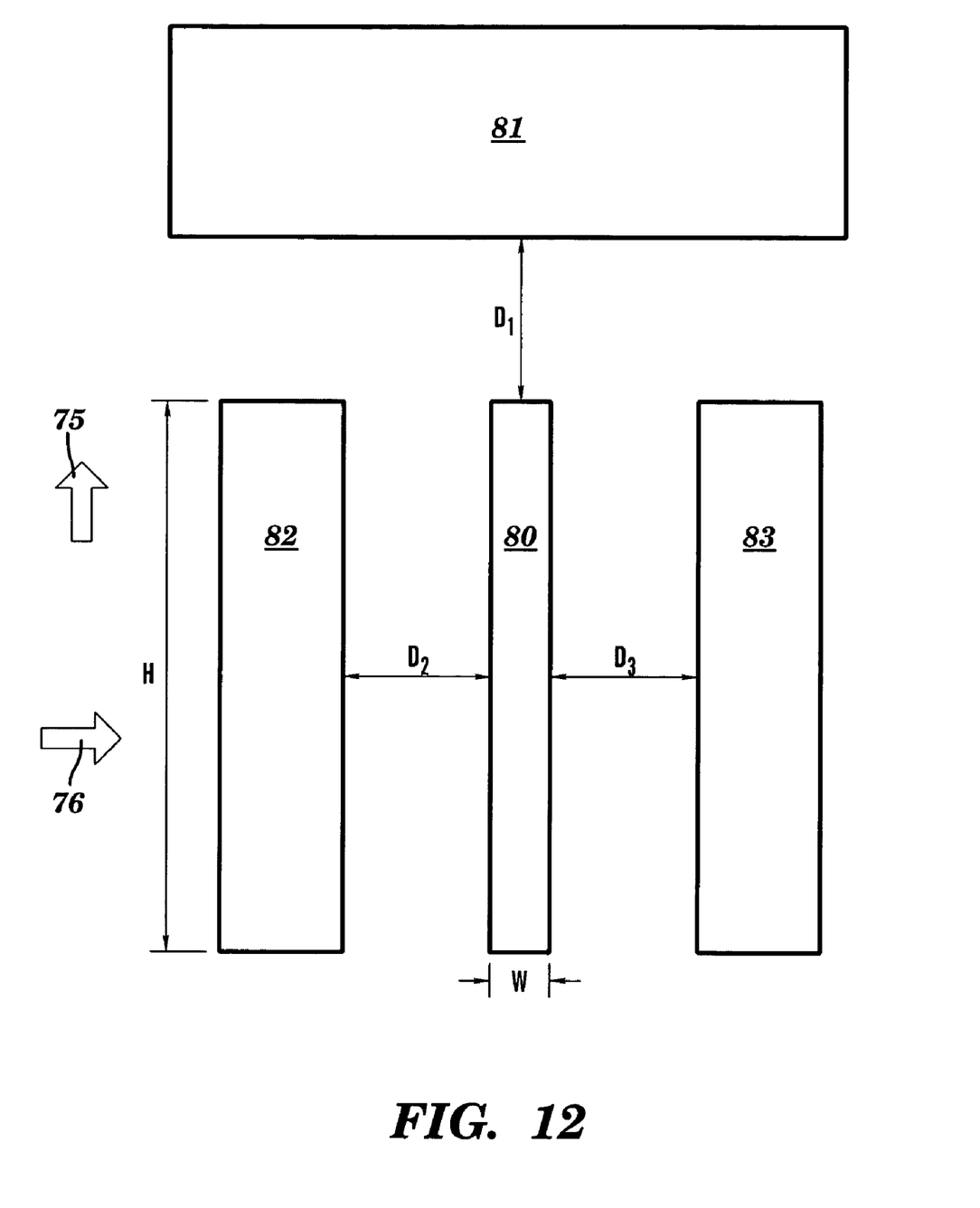
FIG. 12 depicts a shape and its neighbors in a mask fabrication database, in accordance with embodiments of the present invention.

FIG. 12 depicts shapes 80-83 in a mask fabrication database, in accordance with embodiments of the present invention. Shapes 81-83 are neighbors of shape 80. While FIG. 12 shows three neighbors 81-83 of the shape 80, the shape may generally have any number of neighbors (e.g., 0, 1, 2, 3, 4, etc. neighbors).

The shape 80 is oriented in the direction 75, has a dimension of H in the direction 75 and a dimension of W in the direction 76. The shape 80 is separated from its neighbors 81, 82, and 83 by a distance $D_1$, $D_2$, and $D_3$, respectively. For some embodiments, distortion of the shape 80 in the directions 75 and 76, in going from the mask fabrication database to the mask inspection database, may be a function of any or all of $D_1$, $D_2$, and $D_3$, in addition to any functional dependence on the dimensions of shape 80 discussed supra in conjunction with FIG. 11.

In summary, the present invention discloses a novel mask inspection method described in the flow chart FIG. 9 and a system that performs the method. The system comprises a first subsystem that performs steps 51-54 of FIG. 9 and a second subsystem that performs steps 55-61 of FIG. 9. Provided is a mask fabrication database describing geometrical shapes S to be printed on a reticle mask through use of mask fabrication tooling. The shapes S appear on the physical mask as shapes S' upon being printed by the mask fabrication tooling in accordance with the mask fabrication database. At least one of the shapes S' may be geometrically distorted relative to a corresponding at least one of the shapes S due to a lack of precision in the mask fabrication tooling. Also provided is a mask inspection database to be used for inspecting the mask after the mask has been fabricated by the mask fabrication tooling. The mask inspection database describes shapes S" approximating the shapes S'. A geometric distortion between the shapes S' and S" is less than a corresponding geometric distortion between the shapes S' and S. FIGS. 7-8 provide an example of the preceding notion involving S, S', and S", in which the shapes S include shapes 1A and 2A, shapes S' include shapes 1 and 2, and shapes S" comprise shapes 1B and 2B.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A mask inspection method, comprising:
generating a mask fabrication database describing geometrical shapes S to be printed as part of a mask pattern on a reticle to fabricate a mask through use of a mask fabrication tooling, said geometrical shapes S appearing on the mask pattern as geometrical shapes S' upon being printed by the mask fabrication tooling in accordance with the mask fabrication database, at least one of said geometrical shapes S' being geometrically distorted relative to a corresponding at least one of said geometrical shapes S due to a lack of precision in the mask fabrication tooling;
generating a mask inspection database to be used for inspecting the mask after the mask has been fabricated by the mask fabrication tooling using the mask fabrication database, said mask inspection database describing geometrical shapes S" approximating said geometrical shapes S', a geometric distortion between said geometrical shapes S' and said geometrical shapes S" being less than a corresponding geometric distortion between said geometrical shapes S' and said geometrical shapes S;
fabricating the mask via the mask fabrication tooling using the mask fabrication database;
inspecting the fabricated mask using the mask inspection database;
determining an inspection failure rate from said inspecting, said determined inspection failure rate being lower than an inspection failure rate that would have been determined by using the mask fabrication database for inspecting the fabricated mask;
wherein said generating the mask inspection database comprises:
generating a calibration dataset by performing the steps of: providing a plurality of generic geometrical shapes, printing said generic geometrical shapes on a reticle test mask, measuring said printed generic geometrical shapes, and collecting the provided generic geometrical shapes and the measured printed generic geometrical shapes to form the calibration dataset,
deriving a calibration transformation from the calibration dataset by performing a statistical regression on the calibration dataset, and
generating S" from S by applying the calibration transformation to S;
wherein the geometrical shapes S includes a geometric shape $S_1$;
wherein the calibration transformation transforms $S_1$ to a geometric shape $S_1$" of the geometrical shapes S";
wherein a first dimension of $S_1$" in a direction X differs from a corresponding first dimension of $S_1$ in the direction X by a first amount that is a first function of the corresponding first dimension of $S_1$ in the direction X, a second dimension of $S_1$ in a direction Y that is orthogonal to the direction X, and a distance from $S_1$ to a first neighbor of $S_1$, said first neighbor of $S_1$ being a geometric shape comprised by the geometrical shapes S;
wherein a second dimension of $S_1$" in the direction Y differs from a corresponding second dimension of $S_1$ in the direction Y by a second amount that is a second function of the corresponding second dimension of $S_1$ in the direction Y, a third dimension of $S_1$ in the direction X, and a distance from $S_1$ to a second neighbor of $S_1$, said second neighbor of $S_1$ being a geometric shape comprised by the geometrical shapes S.

2. A mask inspection system, comprising:
a first subsystem configured to generate a mask fabrication database describing geometrical shapes S to be printed as part of a mask pattern on a reticle to fabricate a mask through use of a mask fabrication tooling, said geometrical shapes S appearing on the mask as geometrical shapes S' upon being printed by the mask fabrication tooling in accordance with the mask fabrication database, at least one of said geometrical shapes S' being geometrically distorted relative to a corresponding at least one of said geometrical shapes S due to a lack of precision in the mask fabrication tooling; and
a second subsystem configured to generate a mask inspection database to be used for inspecting the mask after the mask has been fabricated by the mask fabrication tooling using the mask fabrication database, said mask inspection database describing geometrical shapes S" approximating said geometrical shapes S', a geometric distortion between said geometrical shapes S' and said geometrical shapes S" being less than a corresponding geometric distortion between said geometrical shapes S' and said geometrical shapes S;
wherein the second subsystem is further configured to fabricate the mask via the mask fabrication tooling using the mask fabrication database, inspect the fabricated mask using the mask inspection database, and determine an inspection failure rate from inspecting the fabricated mask;
wherein the mask inspection database is configured to cause the determined inspection failure rate to be lower than an inspection failure rate that would have been determined by using the mask fabrication database for inspecting the fabricated mask;
wherein the second subsystem is configured to generate a mask inspection database by performing a process comprising:
generating a calibration dataset by performing the steps of: providing a plurality of generic geometrical shapes, printing said generic geometrical shapes on a reticle test mask, measuring said printed generic geometrical shapes, and collecting the provided generic geometrical shapes and the measured printed generic geometrical shapes to form the calibration dataset,
deriving a calibration transformation from the calibration dataset by performing a statistical regression on the calibration dataset, and
generating S" from S by applying the calibration transformation to S;
wherein the geometrical shapes S includes a geometric shape $S_1$;
wherein the calibration transformation transforms $S_1$ to a geometric shape $S_1$" of the geometrical shapes S";
wherein a first dimension of $S_1$" in a direction X differs from a corresponding first dimension of $S_1$ in the direction X by a first amount that is a first function of the corresponding first dimension of $S_1$ in the direction X, a second dimension of $S_1$ in a direction Y that is orthogonal to the direction X, and a distance from $S_1$ to a first neighbor of $S_1$, said first neighbor of $S_1$ being a geometric shape comprised by the geometrical shapes S;
wherein a second dimension of $S_1$" in the direction Y differs from a corresponding second dimension of $S_1$ in the direction Y by a second amount that is a second function of the corresponding second dimension of $S_1$ in the direction Y, a third dimension of $S_1$ in the direction X, and a distance from $S_1$ to a second neighbor of $S_1$, said second neighbor of $S_1$ being a geometric shape comprised by the geometrical shapes S.

* * * * *